(12) United States Patent
Kim

(10) Patent No.: US 7,099,357 B2
(45) Date of Patent: Aug. 29, 2006

(54) WAVELENGTH-TUNABLE LASER APPARATUS

(75) Inventor: Se-Yoon Kim, Anyang-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 232 days.

(21) Appl. No.: 10/721,711

(22) Filed: Nov. 25, 2003

(65) Prior Publication Data

US 2004/0264514 A1 Dec. 30, 2004

(30) Foreign Application Priority Data

Jun. 30, 2003 (KR) ...................... 10-2003-0043851

(51) Int. Cl.
*H01S 3/10* (2006.01)
(52) U.S. Cl. .......................... 372/20; 372/32
(58) Field of Classification Search ................. 372/93, 372/94, 97, 32, 102
See application file for complete search history.

(56) References Cited

U.S. PATENT DOCUMENTS

| 5,771,251 A | * | 6/1998 | Kringlebotn et al. | .......... 372/6 |
| 6,320,888 B1 | * | 11/2001 | Tanaka et al. | ................. 372/32 |
| 6,704,337 B1 | * | 3/2004 | Kitaoka et al. | .......... 372/50.11 |
| 6,768,098 B1 | * | 7/2004 | Sugden et al. | ......... 250/227.19 |
| 6,885,784 B1 | * | 4/2005 | Bohnert | ........................ 385/12 |
| 6,920,159 B1 | * | 7/2005 | Sidorin et al. | ................. 372/20 |

FOREIGN PATENT DOCUMENTS

EP 0552415 10/1992
JP 2002134833 5/2002

OTHER PUBLICATIONS

"Integrated External Cavity Laser Composed of Spot-Size Converted LD and UV Written Grating in Silica Waveguide on Si;" T. Tanaka et al.; Electronics Letters; Jun. 20, 1996; vol. 32, No. 13; 2 pages.
"45 nm Tunability in C-Band Obtained With External Cavity Laser Including Sampled Fibre Bragg Grating;" H. Helmers et al.;Electronics Letters; Nov. 21, 2002; vol. 38, No. 24; 2 pages.
"100-Ghz Spacing Eight-Channel Light Source Integrated With Gratings and LDs on PLC Platform;" T. Tanaka et al.; IEEE Photonics Technology Letters; Sep. 9, 2002; vol. 12, No. 19; 3 pages.
T. Tanaka et al.; "Integrated External Cavity Laser Composed of Spot-Size Converted LD and UV Written Grating in Silica Waveguide on Si;" IEEE Electronics Letters, vol. 32, No. 13; Jun. 20, 1996; 2 pgs.
H. Helmers et al.; "45 nm Tunability in C-Band Obtained with External Cavity Laser Including Sampled Fibre Bragg Grating;" IEEE Electronics Letters, vol. 38, No. 24; Nov. 21, 2002; 2 pgs.

* cited by examiner

*Primary Examiner*—James Menefee
*Assistant Examiner*—Tuan N. Nguyen
(74) *Attorney, Agent, or Firm*—Cha & Reiter, L.L.C.

(57) ABSTRACT

A wavelength-tunable laser apparatus includes a semiconductor substrate, a Fabry-Perot (FP) laser, and a planar lightwave circuit. The FP laser is formed on the semiconductor substrate at one side thereof, and has a plurality of longitudinal modes. The planar lightwave circuit is formed on the semiconductor substrate at the other side thereof, and includes a waveguide and a clad surrounding the waveguide with a grating carved into a portion of the waveguide. Light outputted from the FP laser is coupled to the waveguide, the grating reflects a plurality of light beams of different wavelengths, and the FP laser is wavelength-locked by one of the light beams reflected from the grating.

20 Claims, 4 Drawing Sheets

US 7,099,357 B2

WAVELENGTH-TUNABLE LASER APPARATUS

CLAIM OF PRIORITY

This application claims priority to an application entitled "WAVELENGTH-TUNABLE LASER APPARATUS," filed in the Korean Intellectual Property Office on Jun. 30, 2003 and assigned Serial No. 2003-43851,the contents of which are hereby incorporated by reference.

BACKGROUND OF THE INVENTION

1. Field of the Invention

The present invention relates to a light source for optical communication, and more particularly to a wavelength-tunable laser apparatus.

2. Description of the Related Art

A wavelength-division-multiplexed passive optical network (WDM-PON) employs unique wavelengths assigned to respective subscribers to provide high-speed wideband communication services. The development of an economical WDM light source is essential for implementing WDM-PONs. The wavelength-locked Fabry-Perot laser has been proposed as a source, since it is low-priced, can achieve frequency stabilization by outputting only light of wavelength that coincides with inputted light of a desired power level or more, and improves transmission performance by increasing the SMSR (Side Mode Suppression Ratio). The SMSR represents the ratio of the intensity of the light beam outputted after being amplified to the intensity of the light beams outputted after being suppressed, as will be discussed in more detail below. An external diffraction grating, a fiber Bragg grating, and an FP filter are used to induce a wavelength-locked phenomenon in the FP laser.

FIG. 1 depicts the configuration of a conventional laser apparatus using an external diffraction grating. The laser apparatus 100 includes an FP laser 110, a RF source 120, first and second lenses 130 and 135, an optical coupler 150, and a diffraction grating 160.

The FP laser 110 outputs light modulated based on an electrical signal inputted from the RF source 120. The first lens 130 couples the light outputted from the FP laser 110 into a first optical fiber 141. The first optical fiber 141 is connected to one end of the optical coupler 150, and second and third optical fibers 142, 143 are connected to the other end thereof. The optical coupler 150 transmits the light inputted through the first optical fiber 141 to the second and third optical fibers 142, 143. The light outputted from the second optical fiber 142 is collimated by the second lens 135 to be incident on the diffraction grating 160, and the grating 160 reflects light of a predetermined wavelength. The reflected light is coupled to the second optical fiber 142 through the second lens 135. The optical coupler 150 transmits the reflected light inputted through the second optical fiber 142 to the first optical fiber 141. The reflected light is transmitted through the first optical fiber 141 and is coupled to the laser 110 through the first lens 130. The laser 110 is wavelength-locked by the reflected light, and outputs the wavelength-locked light. By means of the first lens 130 and the optical coupler 150, the wavelength-locked light is transmitted to the third optical fiber 143 for output. The laser device 100 can tune the wavelength of the output light by controlling the reflection wavelength of the diffraction grating 160.

However, the above laser apparatus using the external diffraction grating requires an accurate packaging technology, and the diffraction grating is bulky. Also, applying heat and strain to the fiber Bragg grating for wavelength tuning requires additional devices, and the tunable wavelength range is limited to several nanometers.

SUMMARY OF THE INVENTION

The present invention has been made in view of the above problem, and provides a laser apparatus integrated onto a semiconductor substrate, facilitating both the packaging and the wavelength tuning.

In accordance with the present invention, the above and other aspects can be accomplished by the provision of a wavelength-tunable laser apparatus having a semiconductor substrate; a Fabry-Perot laser formed on the semiconductor substrate, the laser having a plurality of longitudinal modes; and a planar lightwave circuit formed on the semiconductor substrate. The circuit includes a waveguide disposed on the substrate so that light outputted from the laser is coupled to the waveguide. The circuit further features a clad surrounding the waveguide, with a grating being carved into a portion of the waveguide, The grating reflects light beams of different wavelengths, and the Fabry-Perot laser is wavelength-locked by one of the reflected light beams.

BRIEF DESCRIPTION OF THE DRAWINGS

The above and other aspects, features and advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention will be described in detail with reference to the annexed drawings, with detailed description of known functions and configurations incorporated herein being omitted for clarity of presentation.

Figure 1:
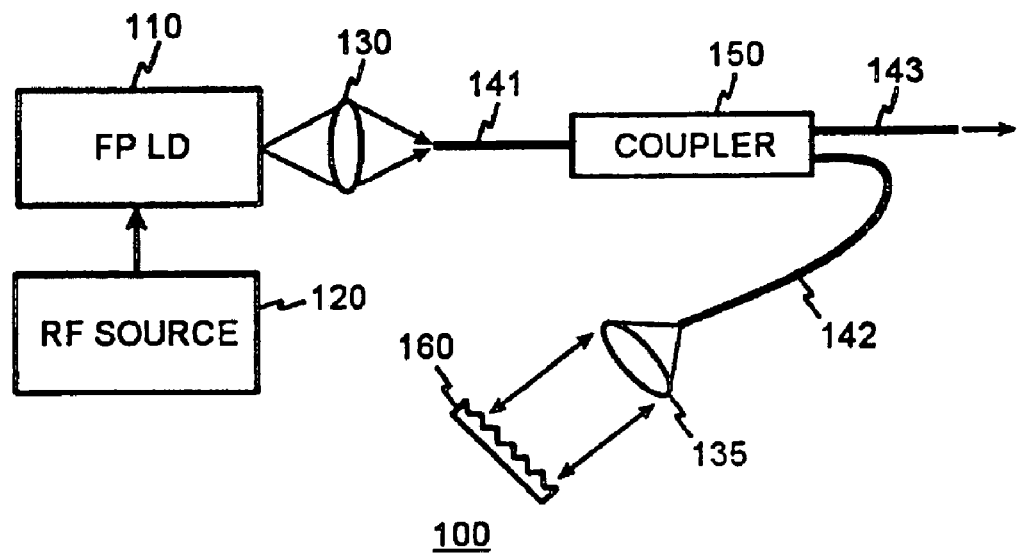
FIG. 1 shows the configuration of a conventional laser apparatus using an external diffraction grating.
Figure 2:
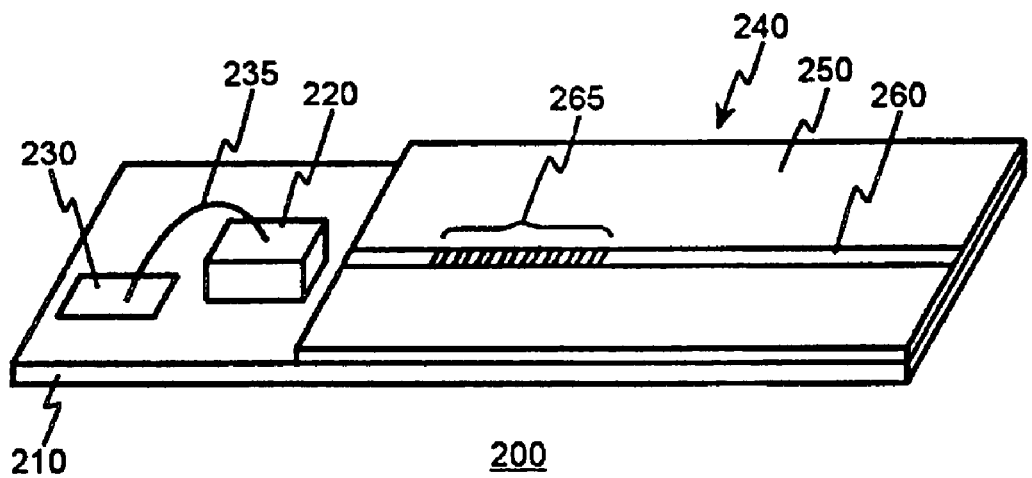
FIG. 2 shows the configuration of a wavelength-tunable laser apparatus according to a preferred embodiment of the present invention.

FIG. 2 shows, by way of non-limitative example, the configuration of a wavelength-tunable laser apparatus 200 according to a preferred embodiment of the present invention. The laser apparatus 200 includes a semiconductor substrate 210, a Fabry-Perot laser 220, and a planar lightwave circuit (PLC) 240.

The FP laser 220 is formed on the semiconductor substrate 210 at one side portion thereof, and a bonding pad 230 for externally applying a RF signal to the FP laser 220 is formed on the substrate near the FP laser. The bonding pad 230 and the FP laser 220 are wire-bonded to each other through a wire 235. The FP laser 220 has a plurality of longitudinal modes that are arranged at intervals of a predetermined wavelength, centered on a longitudinal mode having a peak value, according to the gain characteristics of the material of the laser.

The planar lightwave circuit 240 is formed on the semiconductor substrate 210 at the other side thereof, and includes a waveguide 260 and a clad 250 surrounding the waveguide 260, with a grating 265 carved into a portion of the waveguide 260. In the embodiment shown, the substrate 210 longitudinally has two ends, the laser 220 being disposed at one end and the circuit 240 being disposed at the other end. Preferably, no optics intervene between the laser 220 and the waveguide 260 which are mutually disposed on the substrate 210 in direct light-communicative alignment. The grating 265 reflects a plurality of light beams of different wavelengths, and may include a sampled Bragg grating or a moiré grating. First, its manufacturing method is described as follows when the grating 265 is a sampled Bragg grating.

Figure 3:
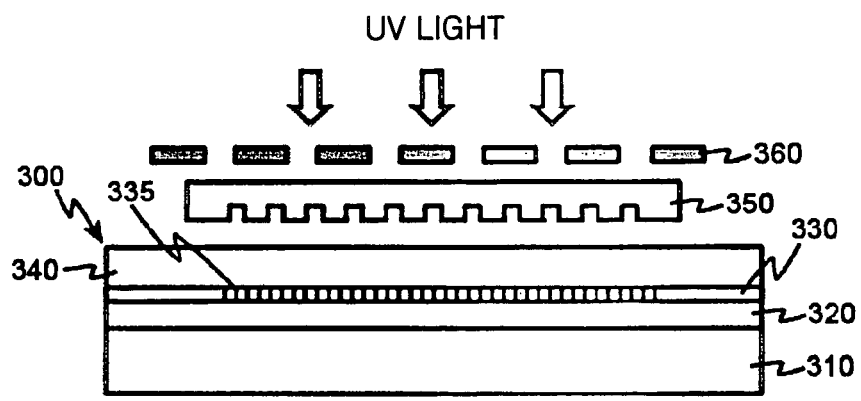
FIG. 3 illustrates a method for forming a sampled Bragg grating.
Figure 4:
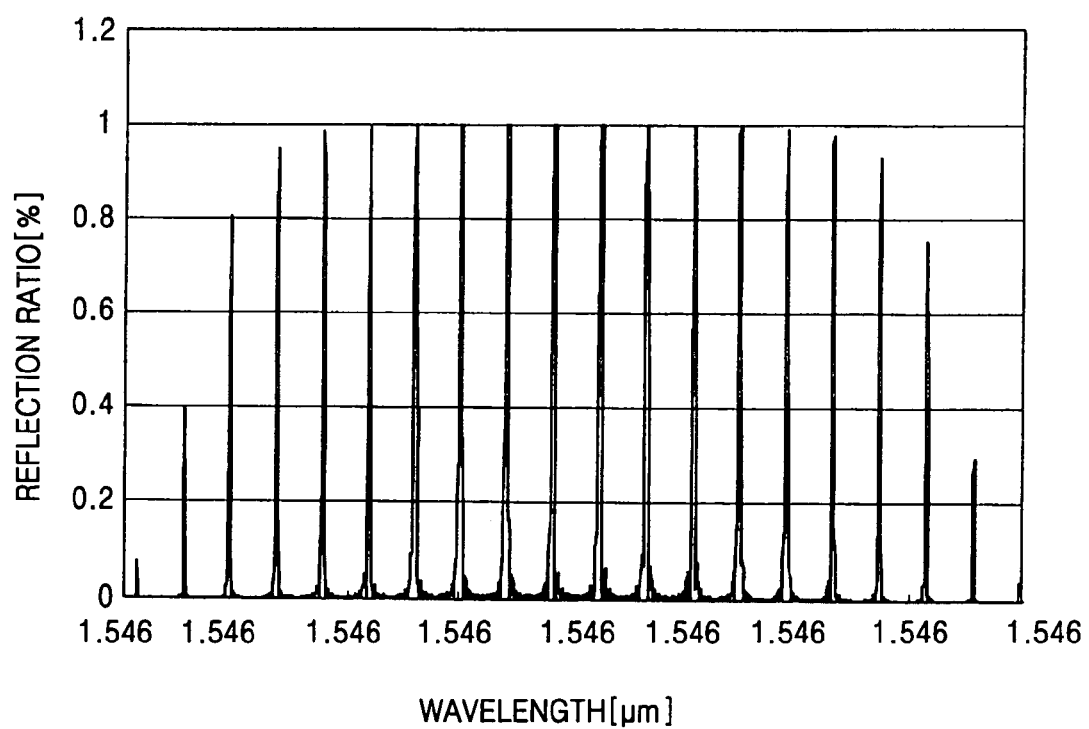
FIG. 4 shows the reflection spectrum of the sampled Bragg grating.

FIG. 3 illustrates a method for forming the sampled Bragg grating, and FIG. 4 shows the reflection spectrum of the sampled Bragg grating. In FIG. 3, shown are a semiconductor substrate 310, a planar lightwave circuit 300 including a lower clad 320, a waveguide 330 and an upper clad 340 sequentially deposited on the substrate 310, a phase mask 350 arranged over the planar lightwave circuit 300, and an amplitude mask 360 arranged over the phase mask 350. When ultraviolet light is irradiated to the amplitude mask 360, ultraviolet light passing through slits in the amplitude mask 360 is incident on the phase mask 350. The phase mask 350 diffracts the incident light, and an interference pattern of the diffracted light is formed on the waveguide 330. The waveguide 330 has an ultraviolet sensitivity so that a sampled grating 335 coinciding with the interference pattern is formed on the waveguide 330. The grating 335 is periodically amplitude-modulated by the amplitude mask 360. In this case, or in the case where it is periodically phase-modulated, a multiple reflection spectrum having a wavelength interval Δλ, as expressed in the following Equation 1, is obtained, as shown in FIG. 4.

$$\Delta\lambda = \frac{\lambda_B^2}{(2n_{eff} \times P)} \qquad \text{[Equation 1]}$$

In Equation 1, "Δλ" denotes the wavelength interval of the multiple reflection spectrum, "$\lambda_B$" denotes the central wavelength of the grating 335, "$n_{eff}$" denotes an effective refractive index, and "P" denotes the modulation period of the grating 335.

The reflection ratio with respect to the reflection wavelength of the grating 335 is represented by a Fourier transform of the grating amplitude, so that the reflection ratio has the form of a sinc function as a whole, and the bandwidth of each reflected light depends on the length of the whole grating 335.

A method for manufacturing the grating 265 shown in FIG. 2 will now be described when it is a moiré grating. In this method, gratings of different periods are overlapped, for example, in such a manner that a first grating is formed on a waveguide using a first diffraction grating of a first period, and a second grating is formed on the waveguide using a second diffraction grating of a second period, so as to overlap the first grating. In this case, since the central wavelengths of gratings to be formed on the waveguide each depends on a phase mask used in forming each grating, the phase mask periods can be adjusted to control an interval between the reflection wavelengths.

Advantageously, because a plurality of gratings are formed on the waveguide at the same position, the above manufacturing method for moiré gratings achieves integration without an increase in size even though there are a plurality of reflection wavelengths.

Figure 5:
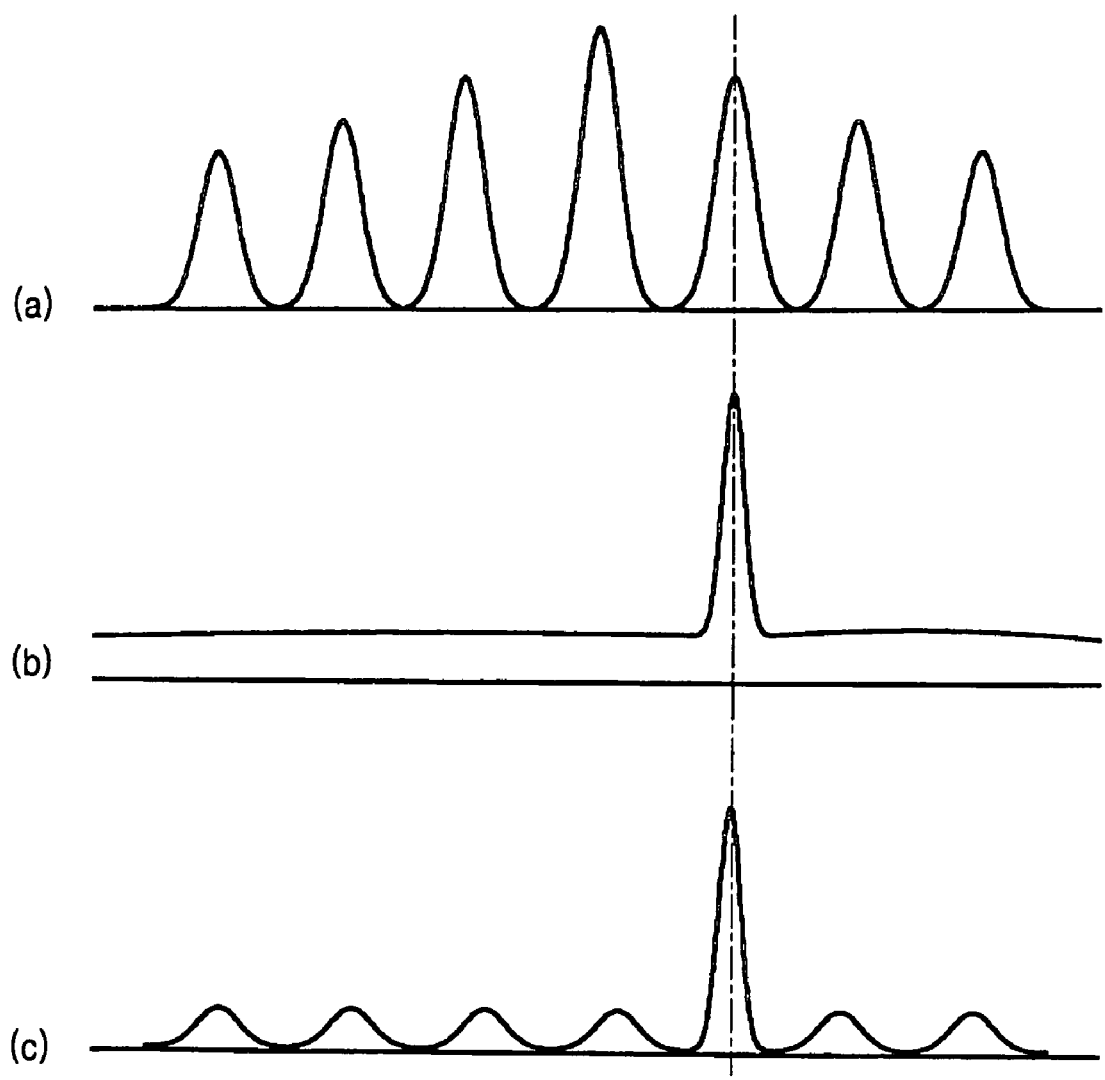
FIGS. 5a to 5c illustrate a wavelength-locked phenomenon of the Fabry-Perot laser shown in FIG. 2.

FIGS. 5a to 5c illustrate a wavelength-locked phenomenon of the Fabry-Perot laser 220 shown in FIG. 2. FIG. 5a shows a mode spectrum of the FP laser 220 before it is wavelength-locked. The laser 220 has a plurality of longitudinal modes that are arranged at intervals of a predetermined wavelength, centered on a longitudinal mode having a peak value, according to the gain characteristics of the material of the laser. FIG. 5b shows a spectrum of light of a specific wavelength inputted to the laser 220. FIG. 5c shows an optical spectrum of the FP laser 220 when it is wavelength-locked. In this case, wavelengths not coinciding with the wavelength of the inputted light are suppressed, and only light of the coincident wavelength is amplified and outputted. As mentioned above, the intensity of the light beam outputted after being amplified in proportion to those of the light beams outputted after being suppressed is called an "SMSR" (Side Mode Suppression Ratio). An increase in the SMSR decreases performance degradation of transmission occurring due to a chromatic dispersion effect in an optical fiber and a mode partition noise occurring in the laser 220. It is possible to economically perform long-distance transmission of data at high rates by directly modulating the wavelength-locked FP laser 220.

Figure 6:
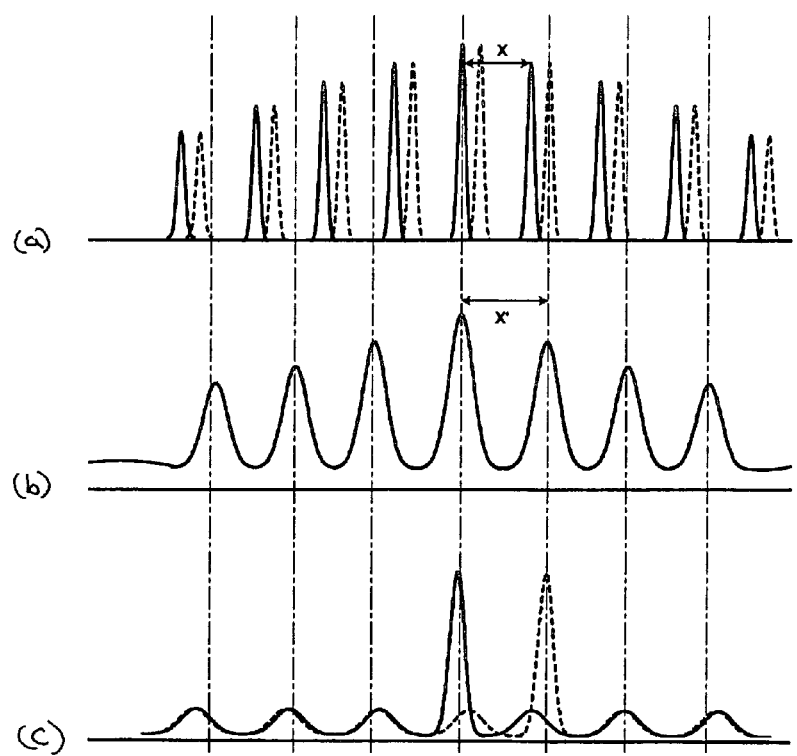
FIGS. 6a to 6c illustrate a wavelength tuning method of the Fabry-Perot laser shown in FIG. 2.

FIGS. 6a to 6c illustrate a wavelength tuning method of the FP laser 220 shown in FIG. 2. FIG. 6a shows the movement of longitudinal modes of the FP laser 220 with respect to the change of its operating temperature. In this drawing, a solid line represents longitudinal modes at an initial temperature, and a dotted line represents longitudinal modes after the temperature is changed, where the longitudinal modes are arranged at intervals of a specific wavelength x. FIG. 6b shows the spectrum of reflection light beams inputted to the laser 220, where reflection light beams of different wavelengths are arranged at intervals of a specific wavelength x'. FIG. 6c shows the change of the optical spectrum of the wavelength-locked FP laser 220 with respect to the change of the operating temperature. In this drawing, a solid line represents an optical spectrum before the temperature is changed, and a dotted line represents an optical spectrum after the temperature is changed. In this case, if the difference between the mode interval x of the laser 220 and the wavelength interval x' of light beams reflected by the grating 265 corresponds to about several GHz, it is possible to perform a single mode oscillation because there is only one overlapped wavelength even if a plurality of light beams are reflected by the grating 265. When changing the operating temperature of the laser 220, a phase change occurs in the laser 220 to move the longitudinal modes. Concurrent with mode movement is the phenomenon of overlapping with a wavelength different from the firstly-overlapped wavelength so as to change the oscillation wavelength. A wavelength-tunable laser can be realized in this way. Further, when the grating 265 is fabricated such that the wavelength interval of light beams reflected by the grating 265 corresponds to 100 GHz, 200 GHz, etc., prescribed in the WDM transmission, it is possible to perform channel switching while performing the wavelength tuning. In order to control the operating temperature of the FP laser 220, the wavelength-tunable laser apparatus 200 may be loaded on the upper surface of a thermoelectric cooler TEC serving as a temperature control element.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A wavelength-tunable laser apparatus comprising:
   a semiconductor substrate;
   a Fabry-Perot laser formed on the semiconductor substrate, the laser having a plurality of longitudinal modes; and
   a planar lightwave circuit formed on the semiconductor substrate, the circuit including a waveguide disposed on the substrate so that light outputted from the laser is coupled to the waveguide, the circuit further including a clad surrounding the waveguide, with a grating being carved into a portion of the waveguide, the grating reflecting a plurality of light beams of different wavelengths, the Fabry-Perot laser being wavelength-locked by one of the plural reflected light beams;
   wherein a wavelength interval between the plurality of longitudinal modes of Fabry-Perot laser and a wavelength interval between the plurality of light beams are different than each other, and operating temperature of the Fabry-Perot laser is controlled for wavelength tuning by wavelength-locking of another one of the plural reflected light beams.

2. The laser apparatus as set forth in claim 1, wherein the grating is a sampled grating that is fabricated using both a phase mask and an amplitude mask together.

3. The laser apparatus as set forth in claim 1, wherein the grating is a moire grating formed by overlapping gratings of different periods.

4. The laser apparatus as set forth in claim 1, wherein the substrate longitudinally has two ends, the laser being disposed at one of the ends and the circuit being disposed at the other end.

5. The laser apparatus as set forth in claim 4, wherein the laser is disposed on the substrate in direct light-communicative alignment with the waveguide without any intervening optics.

6. The laser apparatus as set forth in claim 1, wherein the laser is disposed on the substrate in direct light-communicative alignment with the waveguide without any intervening optics.

7. The laser apparatus as set forth in claim 1, further comprising a bonding pad formed on the substrate for externally applying a RF signal to the laser.

8. The laser apparatus as set forth in claim 7, wherein the bonding pad and the laser are wire-bonded to each other through a wire.

9. The laser apparatus as set forth in claim 8, wherein the grating is a sampled grating that is fabricated using both a phase mask and an amplitude mask together.

10. The laser apparatus as set forth in claim 8, wherein the grating is a moiré grating formed by overlapping gratings of different periods.

11. A method for creating a wavelength-tunable laser apparatus comprising the steps of:
    providing a semiconductor substrate;
    forming, on the substrate, a Fabry-Perot laser having a plurality of longitudinal modes; and
    forming, on the substrate, a planar lightwave circuit including a waveguide disposed on the substrate so that light outputted from the laser is coupled to the waveguide, the circuit further including a clad surrounding the waveguide, with a grating being carved into a portion of the waveguide, the grating reflecting a plurality of light beams of different wavelengths, the Fabry-Perot laser being wavelength-locked by one of the plural reflected light beams;
    wherein a wavelength interval between the plurality of longitudinal modes of Fabry-Perot laser and a wavelength interval between the plurality of light beams are different than each other, and operating temperature of the Fabry-Perot laser is controlled for wavelength tuning by wavelerndh-locking of another one of the plural reflected light beams.

12. The method as set forth in claim 11, wherein the circuit forming step further comprises the step of using both a phase mask and amplitude mask together in forming said grating as a sampled grating.

13. The method as set forth in claim 11, wherein the circuit forming step further comprises the step of overlapping gratings of different periods to form said grating as a moiré grating.

14. The method as set forth in claim 11, wherein the substrate longitudinally has two ends, the laser being disposed at one of the ends and the circuit being disposed at the other end.

15. The method as set forth in claim 14, wherein the forming steps are performed so that the laser is disposed on the substrate in direct light-communicative alignment with the waveguide without any intervening optics.

16. The method as set forth in claim 11, wherein the forming steps are performed so that the laser is disposed on the substrate in direct light-communicative alignment with the waveguide without any intervening optics.

17. The method as set forth in claim 11, further comprising the step of forming a bonding pad on the substrate for externally applying a RF signal to the laser.

18. The method as set forth in claim 17, further comprising the step of using a wire to wire-bond to each other the bonding pad and the laser.

19. The method as set forth in claim 18, wherein the circuit forming step further comprises the step of using both a phase mask and amplitude mask together in forming said grating as a sampled grating.

20. The method as set forth in claim 18, wherein the circuit forming step further comprises the step of overlapping gratings of different periods to form said grating as a moiré grating.

* * * * *